(12) United States Patent
Ribeiro do Nascimento

(10) Patent No.: US 10,254,317 B1
(45) Date of Patent: Apr. 9, 2019

(54) LOW-CURRENT CIRCUITS FOR SUPPLY VOLTAGE LEVEL DETECTION

(71) Applicant: NXP USA, INC., Austin, TX (US)

(72) Inventor: Ivan Carlos Ribeiro do Nascimento, Campinas (BR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/955,358

(22) Filed: Apr. 17, 2018

(51) Int. Cl.
| H03K 19/0175 | (2006.01) |
| G01R 19/165 | (2006.01) |
| H03K 19/0185 | (2006.01) |
| H03K 19/177 | (2006.01) |

(52) U.S. Cl.
CPC .......... G01R 19/16576 (2013.01); H03K 19/018507 (2013.01); H03K 19/018557 (2013.01); H03K 19/17784 (2013.01); H03K 19/17788 (2013.01)

(58) Field of Classification Search
CPC ... H03K 19/018557; H03K 19/018507; H03K 19/7784; H03K 19/17788; G01R 19/16576
USPC .......................................................... 326/68
See application file for complete search history.

(56) References Cited

U.S. PATENT DOCUMENTS

| 5,420,798 A | 5/1995 | Lin et al. |
| 5,936,444 A | 8/1999 | Pathak et al. |
| 9,092,045 B2 | 7/2015 | Nascimento |
| 2010/0148818 A1* | 6/2010 | Deutscher ........ H03K 3/356017 326/34 |
| 2014/0253209 A1* | 9/2014 | Chu .......... H03L 5/00 327/333 |
| 2014/0300188 A1* | 10/2014 | Boezen .......... H02M 5/293 307/31 |
| 2015/0362970 A1* | 12/2015 | Aggarwal .......... G06F 1/28 713/300 |
| 2016/0372453 A1* | 12/2016 | Suzuki ............ H01L 27/0255 |
| 2017/0222649 A1* | 8/2017 | Koo ............ H03K 19/017518 |
| 2018/0164376 A1* | 6/2018 | Ge .................. G01R 31/31721 |

OTHER PUBLICATIONS

Wadhwa, et al., "Zero Steady State Current Power-on-Reset Circuit with Brown-Out Detector," Proceedings of the 19th International Conference on VLSI Design (VLSID '06), 1063-9667/06, 2006, 6 pages, publisher IEEE.

* cited by examiner

*Primary Examiner* — Don Le

(57) ABSTRACT

An Integrated Circuit (IC) as described herein may include a first logic circuit, a second logic circuit coupled to the first logic circuit via a level shifter, and a safe state circuit coupled to the first logic circuit and to a first input of a logic gate. For example, a second input of the logic gate may be coupled to an output of the level shifter, and an output of the logic gate may be coupled to the second logic circuit. The safe state circuit may further include a front-end portion; a reversible current mirror portion coupled to the front-end portion; and a voltage-level translation portion coupled to the reversible current mirror portion.

20 Claims, 11 Drawing Sheets

LOW-CURRENT CIRCUITS FOR SUPPLY VOLTAGE LEVEL DETECTION

FIELD

This disclosure relates generally to integrated circuits, and more specifically, to low-current circuits for supply voltage level detection.

BACKGROUND

Within a modern Integrated Circuit (IC) such as a System-on-Chip (SoC), there may be a number of different logic domains. For example, in some architectures, a core circuit (e.g., a Central Processing Unit or CPU) may be located in a first logic domain (e.g., ~1.1 V) and other circuitry, such as an Input/Output (I/O) interface circuit, may be located in a second logic domain(s) (e.g., ~1.8 V, 3.3 V, or 5 V). To facilitate the communication of electrical signals between these different domains, level shifters may be used.

As the inventor hereof has recognized, however, level shifters do not work properly if power is not fully present in the logic domain that originates the signal to be communicated. To address these, and other problems, the inventor hereof has developed safe state circuits configured to perform logic domain power-on detection, and to gate a level shifter's output while power is not being properly supplied to a logic domain.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

Systems and methods for low-current circuits for supply voltage level detection are disclosed. Techniques discussed herein may be particularly applicable in the design, manufacture, and operation of Integrated Circuits (ICs) that include distinct logic, power, or voltage domains.

In various implementations, a safe state circuit may be used as a logic domain power-on detector. The output of the power-on detector may then be used to a gate level shifter's output when a power domain is not properly supplied. Such a safe state circuit may simplify inter-domain logic communication validation, and it may make it easier to develop ICs, such as Systems-On-Chip (SOCs) or the like, that do not require power sequencing. Moreover, a safe state circuit, as described herein, may have very low power consumption (almost zero), and may be very compact in silicon area.

Figure 1:
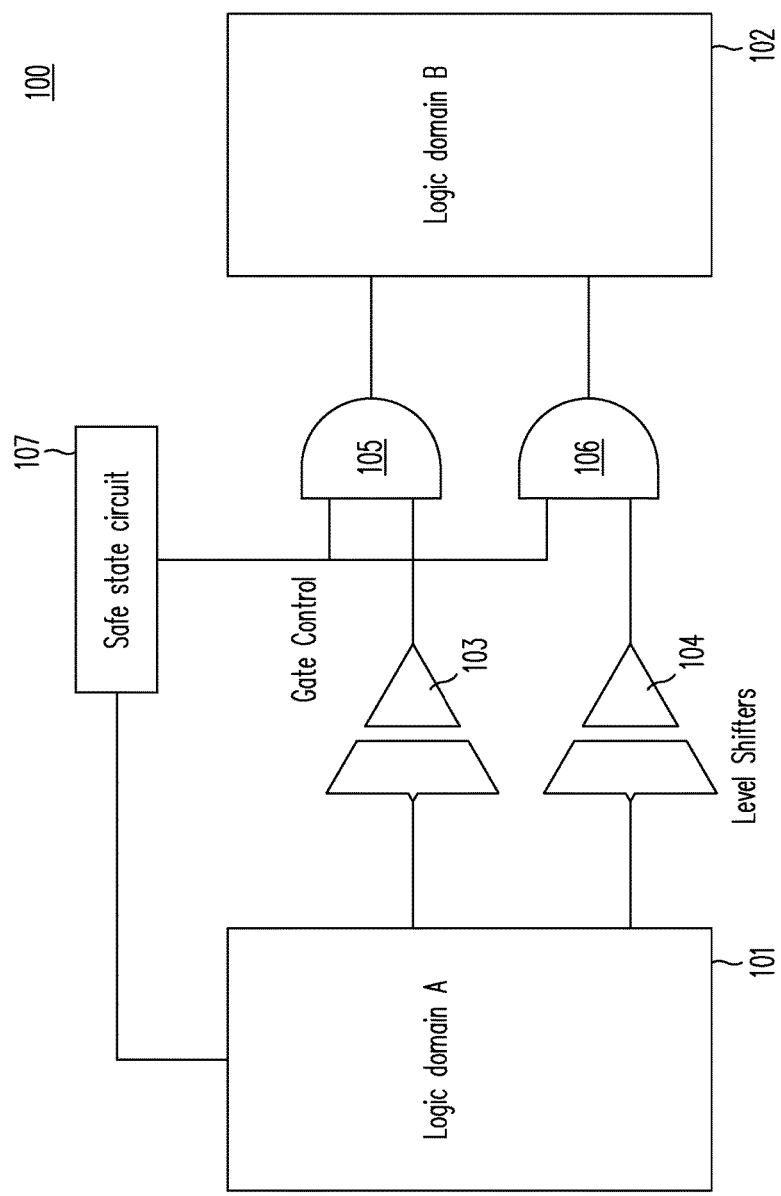
FIG. 1 is a block diagram of an Integrated Circuit (IC) with different logic domains according to some embodiments.

FIG. 1 is a block diagram of an Integrated Circuit (IC) 100 with different logic domains according to some embodiments. Particularly, IC 101 includes first logic domain 101 and second logic domain 102. In this example, first logic domain 101 (e.g., 1.1 V) may include a Central Processing Unit (CPU), Graphic Processing Unit (GPU), or the like; and it may command all other blocks located in other power domains (e.g., second logic domain 102) to perform their respective operations.

Level shifters 103 and 104 may be used to translate a logic signal of first logic domain 101 to second logic domain 102. When first logic domain 101 and second logic domain 102 have intercommunications, they need to accept the signals from other logic only when the power supply to that logic is high enough to make level shifters 103 and 104 work properly.

In FIG. 1, logic gates 105 and 106 may be used to control the logic propagation from first logic domain 101 into second logic domain 102. In case a signal from first logic domain 101 is not being supplied, a "gate control" signal may be used to set the output logic from first logic domain 101 to a default value (first logic domain 101's reset values).

In various embodiments, safe state circuit 107 may be used to monitor and validate the voltage or power supply of first logic domain 101, and to generate gate control signals. The safe state circuits described here have very low current consumption and may have a threshold with low variation.

Figure 2:
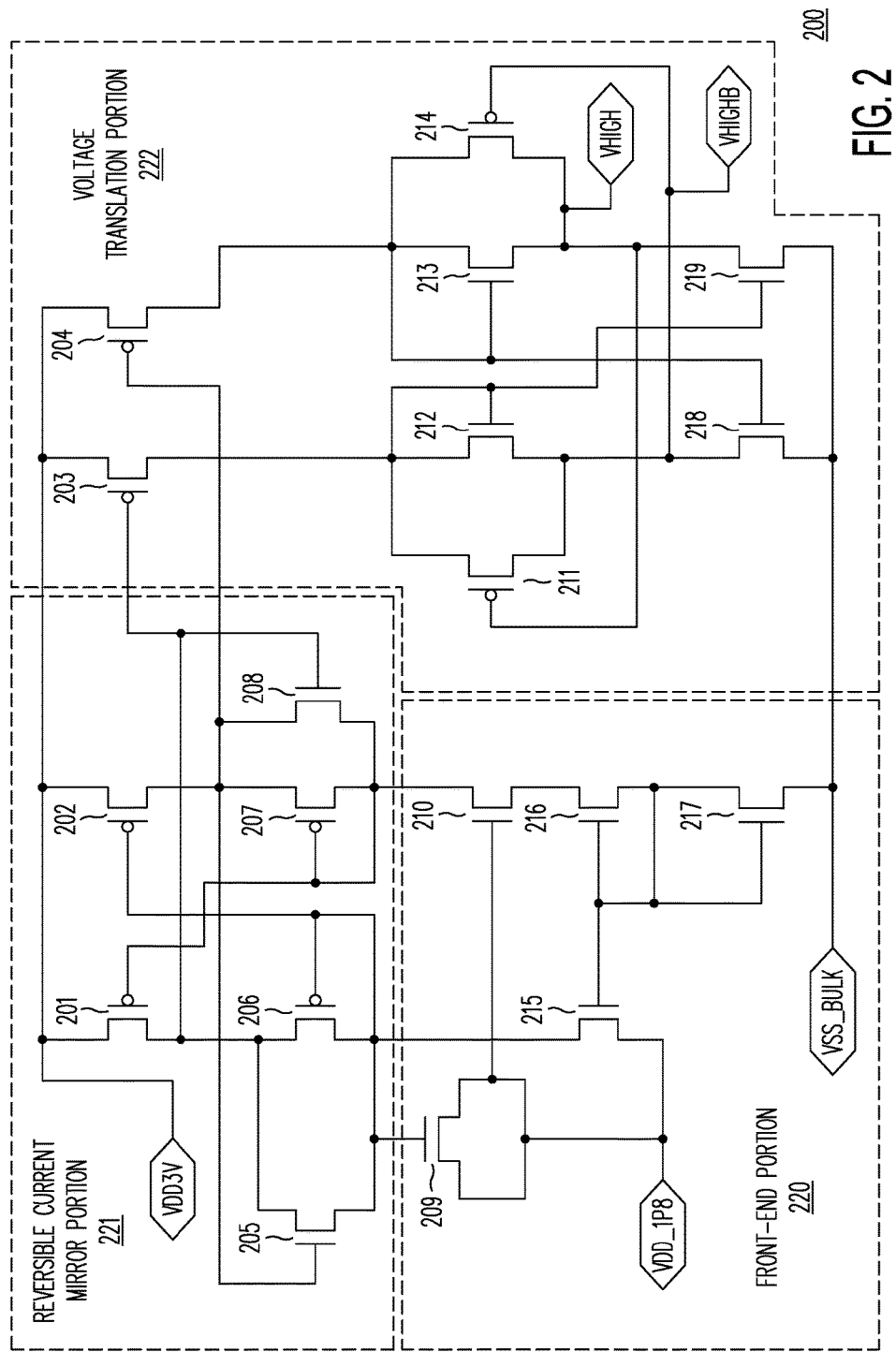
FIG. 2 is a schematic diagram of an example of a low-current circuit for supply voltage level detection circuit according to some embodiments.

In the first illustrative, non-limiting embodiment shown in FIG. 2, circuit 200 provides an implementation of safe state circuit 107 that is generally applicable to thresholds of 0.8 V and above, therefore particularly suitable for monitoring and validating the voltage or power supply of peripheral logic domains. In the second illustrative, non-limiting embodiment shown in FIG. 7, circuit 700 provides another implementation of safe state circuit 2017 that is generally applicable to thresholds of around 0.3 V, making it particularly suitable for monitoring and validating the voltage or power supply of core logic domains.

FIG. 2 is a schematic diagram of an example of a low-current circuit for supply voltage level detection circuit according to some embodiments. As shown, circuit 200 includes the following pins: ground pin ("vss_bulk"); supply pin ("vdd3v"), which in this implementation is the same supply of second logic domain 202; and input pin ("vdd_1p8"), which is connected to the supply of the logic domain having its output signals monitored and validated (that is, first logic domain 101, in the example of FIG. 1).

In various embodiments, either of the two complementary output pins "vhigh" or "vhighb" of circuit 200 may be coupled to the inputs of logic gates 105 and 106, to force the outputs of logic gates 105 and 106 to a desired value, while the voltage at input pin vdd_1p8 has not yet reached a selected threshold sufficient for the proper operation of first logic domain 101.

Moreover, components of circuit 200 may be split into front-end portion 220, reversible current mirror portion 221 (coupled to front-end portion 220), and voltage-level translation portion 222 (coupled to reversible current mirror portion 221). Generally, front-end portion 220 may be configured to monitor the supply voltage of logic domain 101. Reversible current mirror portion 221 may be configured to keep electrical currents flowing in each of its branches approximately equal to each other, and also equal to the minimum current that would be pulled by either branch. And voltage-level translation portion 222 may operate as a low-voltage level shifter suitable for use with subthreshold logic.

In front-end portion 220, first n-type transistor 217 (e.g., an n-type metal-oxide semiconductor or NMOS transistor) has a source terminal coupled to ground (vss_bulk). First natural threshold transistor 216 has a source terminal coupled to a drain terminal of first n-type transistor 217, and a gate terminal coupled to a gate terminal of first n-type transistor 217. Second natural threshold transistor 215 has a gate terminal coupled to the gate terminal of first n-type transistor 217, and a source terminal coupled to vdd_1p8—the supply voltage of the first logic circuit or domain 101. Second n-type transistor 210 has a source terminal coupled to a drain terminal of first natural threshold transistor 216 and a gate terminal coupled to the first supply voltage vdd_1p8.

It should be noted that a natural threshold (or "zero $V_{TH}$") transistor may be used here because, close to 0 V of gate-to-source voltage bias, such a transistor has some current (much larger than other devices' currents). The threshold voltages of these transistors are often negative or very close to 0 V. Moreover, a zero $V_{TH}$ transistor may be turned off when the voltage in its source is higher than its gate. The behavior of a natural threshold transistor becomes comparable to that of a standard transistor when its source voltage is equal to 0.6 V.

In reversible current mirror portion 221, first p-type transistor 207 has a drain terminal coupled to a drain terminal of second n-type transistor 210. Second p-type transistor 202 has a drain terminal coupled to a source terminal of second p-type transistor 202 and a source terminal coupled to a second supply voltage vdd3v of the second logic circuit 102. Third p-type transistor 206 has a drain terminal coupled to a drain terminal of second natural threshold transistor 215 and a gate terminal coupled to a gate terminal of second p-type transistor 202. Fourth p-type transistor 201 has a source terminal coupled to the second supply voltage vdd3v and a gate terminal coupled to a gate terminal of first p-type transistor 207. The gate terminal of first p-type transistor 207 is coupled to the drain terminal of first p-type transistor 207, and the gate terminal of third p-type transistor 206 is coupled to the drain terminal of third p-type transistor 206.

Third n-type transistor 208 has a drain terminal coupled to the source terminal of first p-type transistor 207 and a source terminal coupled to the drain terminal of first p-type transistor 207. And fourth n-type transistor 205 has a drain terminal coupled to the source terminal of third p-type transistor 206 and a source terminal coupled to a drain terminal of third p-type transistor 206.

Capacitor 209 (implemented as an n-type transistor in this example) is coupled between the source terminal of fourth n-type transistor 205 and the gate terminal of second n-type transistor 210. Fifth p-type transistor 203 has a source terminal coupled to the second supply voltage vdd3v, a gate terminal coupled to a gate terminal of third n-type transistor 208 and to the source terminal of fourth p-type transistor 206. Sixth p-type transistor 204 has a source terminal coupled to the second supply voltage vdd3v, a gate terminal coupled to the drain terminal of second p-type transistor 202 and to a gate terminal of fourth n-type transistor 205.

In voltage-level translation portion 222, fifth n-type transistor 212 has a drain terminal coupled to a drain terminal of fifth p-type transistor 203. Sixth n-type transistor 218 has a drain terminal coupled to a source terminal of fifth n-type transistor 212 and a source terminal coupled to vss_bulk. Seventh n-type transistor 213 has a drain terminal coupled to a drain terminal of sixth p-type transistor 204 and a gate terminal coupled to a gate terminal of sixth n-type transistor 218. Eighth n-type transistor 219 has a drain terminal coupled to a source terminal of seventh n-type transistor 213 and a source terminal coupled to vss_bulk. The drain terminal of fifth n-type transistor 212 is coupled to the gate terminal of fifth n-type transistor 212, and the drain terminal of seventh n-type transistor 213 is coupled to the gate terminal of seventh n-type transistor 213.

Seventh p-type transistor 214 has a source terminal coupled to the drain terminal of seventh n-type transistor 213, a drain terminal coupled to the source terminal of seventh n-type transistor 213, and a gate terminal coupled to a source terminal of the fifth n-type transistor 212. Eighth p-type transistor 211 has a source terminal coupled to a drain terminal of fifth n-type transistor 212, a drain terminal coupled to a source terminal of fifth n-type transistor 212, and a gate terminal coupled to a source terminal of seventh n-type transistor 213.

In contrast with n-type transistors shown in FIG. 2, which have their body voltages tied to vss_bulk, all p-type transistors may have body or bias voltages tied to vdd3v. A gate control signal may be provided at the drain or at the gate terminals of seventh p-type transistor 214.

In circuit 200, the reversible current mirror limits the current on one input to a value around the other input, and this way it acts a circuit that equalizes the two input currents to the minimum one. Particularly, consider in Vi=V (vdd_1p8), and let us calculate the maximum saturation current for second natural threshold transistor 215 (MN5) and second n-type transistor 210 (MN1). These calculated currents will flow in the transistors during state switch. In an out-of-switching state, the reversible current mirror portion of circuit 200 sets the current to the minimum of both currents.

The drain current of first and second n-type transistors 217 (MN10) and 210 (MN1) may be calculated for saturation of weak inversion region using the equations below:

$$I_{DMN10} = I_{SVT}\frac{W_{10}}{L_{10}} e^{\frac{V_{GS10}-V_{TS}}{\eta_S \cdot vt}} = I_{SVT}\frac{W_{10}}{L_{10}} e^{\frac{V_s-V_{TS}}{\eta_S \cdot vt}}$$

$$I_{DMN1} = I_{SVT}\frac{W_1}{L_1} e^{\frac{V_{GS1}-V_{TS}}{\eta_S \cdot vt}} = I_{SVT}\frac{W_1}{L_1} e^{\frac{V_i-V_s-V_{TS}}{\eta_S \cdot vt}}$$

Where: $W_{10}$ and $W_1$ are the transistor effective channel width (m); $L_1$ and $L_{10}$ are the transistor's effective channel length (m); $\eta_s$ is the n-type transistor weak inversion silicon slope; $I_{SVT}$ is the extrapolation of weak inversion current at threshold voltage (A); $V_{TS}$ is the threshold voltage of the n-type transistor (V); and vt=kT/q, with T being the temperature in degrees Kelvin, k being Boltzmann's constant, and q the charge of electron.

Equation of second n-type transistor 210 (MN1) above may be rewritten to calculate $V_{GS1}$ as:

$$V_{GS1} = \eta_S \cdot vt \cdot \ln\left[\frac{I_{DMN1}}{I_{SVT}\frac{W_1}{L_1}}\right] + V_{TS}$$

Since first natural threshold transistor 216 (MN0) is in strong inversion, the voltage drop across drain to source terminals is negligible and then $Vi=V_{GS1}+V_{GS10}$. With this, it is possible to obtain the equation of $I_{DMN1}$ as function of Vi input voltage (considering also that $I_{DMN10}=I_{DMN1}$):

$$I_{DMN1} = I_{SVT}\sqrt{\frac{W_1 \cdot L_{10}}{L_1 \cdot W_{10}}} \cdot e^{\frac{V_i - 2V_{TS}}{2 \cdot \eta_S \cdot vt}}$$

The drain current of second natural threshold transistor 215 (MN5) may be calculated for saturation of weak inversion region using the equation below:

$$I_{DMN5} = I_{NVT}\frac{W_5}{L_5}e^{\frac{V_{GS5}-V_{TN}}{\eta_N \cdot vt}} \quad \text{where: } V_{TN} < 0$$

Where: $W_5$ is the transistor effective channel width (m). $L_5$ is the transistor effective channel length (m). $\eta_{IN}$ is the natural transistor weak inversion silicon slope. $I_{NVT}$ is the natural transistor extrapolation of weak inversion current at threshold voltage(A). $V_{TH}$ is the threshold voltage of natural transistor (V).

Here it is possible to substitute $V_{GS5}$ by $-V_{GS1}$ resulting:

$$I_{DMN5} = I_{NVT}\frac{W_5}{L_5}e^{\frac{-\eta_S \cdot Vt \cdot \ln\left[\frac{I_{DMN1}}{I_{SVT}\frac{W_1}{L_1}}\right] - V_{TS} - V_{TN}}{\eta_n \cdot vt}}$$

$$I_{DMN5} = I_{NVT}\frac{W_5}{L_5} \cdot \left[\frac{I_{SVT}\frac{W_1}{L_1}}{I_{DMN1}}\right]^{\frac{\eta_S}{\eta_n}} \cdot e^{-\frac{V_{TS}+V_{TN}}{\eta_n \cdot vt}}$$

During threshold IDMN5=IDMN1 and therefore:

$$I_{DMN1}^{1+\frac{\eta_S}{\eta_n}} = I_{NVT}\frac{W_5}{L_5} \cdot \left[I_{SVT}\frac{W_1}{L_1}\right]^{\frac{\eta_S}{\eta_n}} \cdot e^{-\frac{V_{TS}+V_{TN}}{\eta_n \cdot vt}}$$

$$I_{DMN1} = I_{DMN5} = \sqrt[1+\frac{\eta_S}{\eta_n}]{I_{NVT}\frac{W_5}{L_5} \cdot \left[I_{SVT}\frac{W_1}{L_1}\right]^{\frac{\eta_S}{\eta_n}} \cdot e^{-\frac{V_{TS}+V_{TN}}{\eta_n \cdot vt}}}$$

And ns/nn~=1 we have:

$$I_{DMN1} = I_{DMN5} \cong \sqrt{I_{NVT} \cdot I_{SVT}\frac{W_5 L_1}{L_5 W_1} \cdot e^{\frac{-V_{TS}-V_{TN}}{\eta_n \cdot vt}}}$$

Solving the equation below for Vi:

$$\sqrt{I_{NVT} \cdot I_{SVT}\frac{W_5 L_1}{L_5 W_1} \cdot e^{\frac{-V_{TS}-V_{TN}}{\eta_n \cdot vt}}} = I_{SVT}\sqrt{\frac{W_1 \cdot L_{10}}{L_1 \cdot W_{10}}} \cdot e^{\frac{V_i - 2V_{TS}}{2 \cdot \eta_S \cdot vt}}$$

Vi threshold is given by:

$$V_i \cong 2 \cdot \eta_S \cdot vt \cdot \ln\left[\sqrt{\frac{I_{NVT} \cdot W_5 \cdot L_{10}}{I_{SVT} \cdot L_5 \cdot W_{10}}}\right] - V_{TN} + V_{TS}$$

The Vi threshold has the first term that has a positive thermal coefficient (because of vt) while the second term has a negative coefficient ($-V_{TN}+V_{TS}$). Moreover, the threshold may be made temperature independent (zero TC).

If Vi<Vs then $I_{DMN5}>I_{DMN1}$. Therefore, the reversible current mirror limits or controls the current through second natural threshold transistor 215 (MN5), such that, given that Va is the voltage at the node between transistors 207 and 210, Vb is the voltage at the node between transistors 206 and 215, Vc is the voltage at the node between transistors 202 and 207, and Vd is the voltage at the node between transistors 201 and 206:

$Vb=Vd\approx Vi$; $Va\approx vdd3v-V_{GSMP4}$; and $Vc=vdd3v$;
$V_{HIGH}=0V$.

Conversely, if Vi>Vs then $I_{DMN5}<I_{DMN1}$, then:

$Va=Vc\approx Vs$; $Vb\approx vdd3v-V_{GSMP5}$; $Vd=vdd3v$;
$V_{HIGH}=0V$; and define $V(a,b,c,d)$, $Vi$, MP4, MP5.

The first natural threshold transistor 216 (MN0) has the role of limit maximum current consumption for some worst-case variations, and may be removed from circuit without functional impact. In an alternative design, a modification may be implemented by connecting gate terminal of second n-type transistor 210 (MN1) to the drain of second threshold transistor 215 (MN5).

Figure 3:
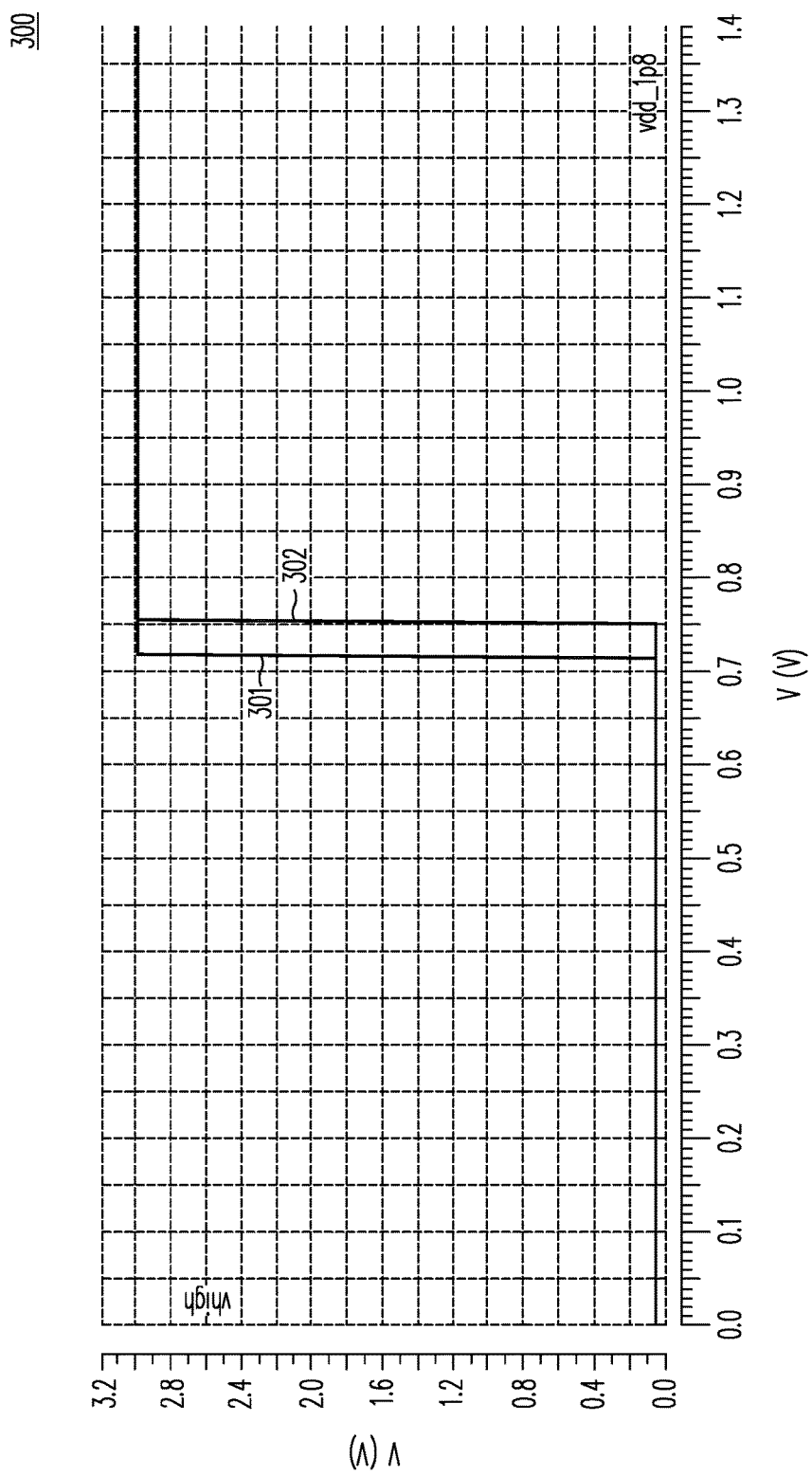
FIG. 3 is a graph illustrating an example of a Direct Current (DC) transfer current for the circuit of FIG. 2 according to some embodiments.

FIG. 3 is a graph illustrating an example of a Direct Current (DC) transfer current for safe state circuit 200 according to some embodiments. Graph 300 includes rising threshold curve 302 and falling threshold curve 301, with a hysteresis effect between them. The hysteresis is caused by the fact that during rising DC sweep, the node at the source of third p-type transistor 206 has a smooth switch, and during the falling sweep this node has an abrupt switching.

Figure 4:
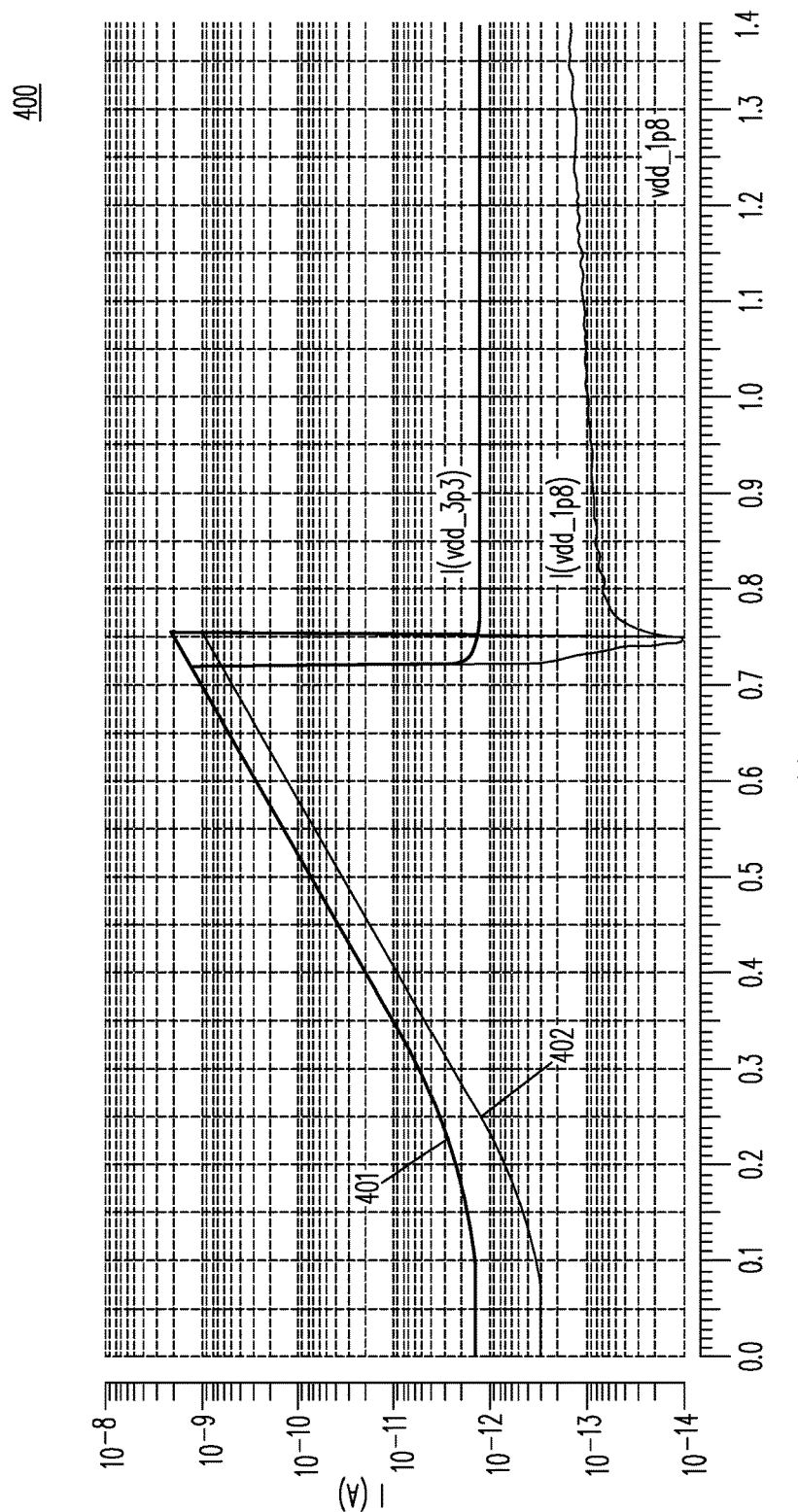
FIG. 4 is a graph illustrating an example of electrical currents in the circuit of FIG. 2 according to some embodiments.

FIG. 4 shows graph 400 illustrating an example of electrical currents in safe state circuit 200 according to some embodiments. Circuit 200 has a low current consumption for all input voltage ranges. During input DC sweep, the supply current curve 401 (vdd_3p3) and the input current curve 402 (vdd_1p8) show that, for input voltages above threshold (>0.8 V) and below 0.3 V, all currents are only a few pico-Amperes; and the maximum DC current close to the threshold is on the range of just few nano-Amperes.

Figure 5:
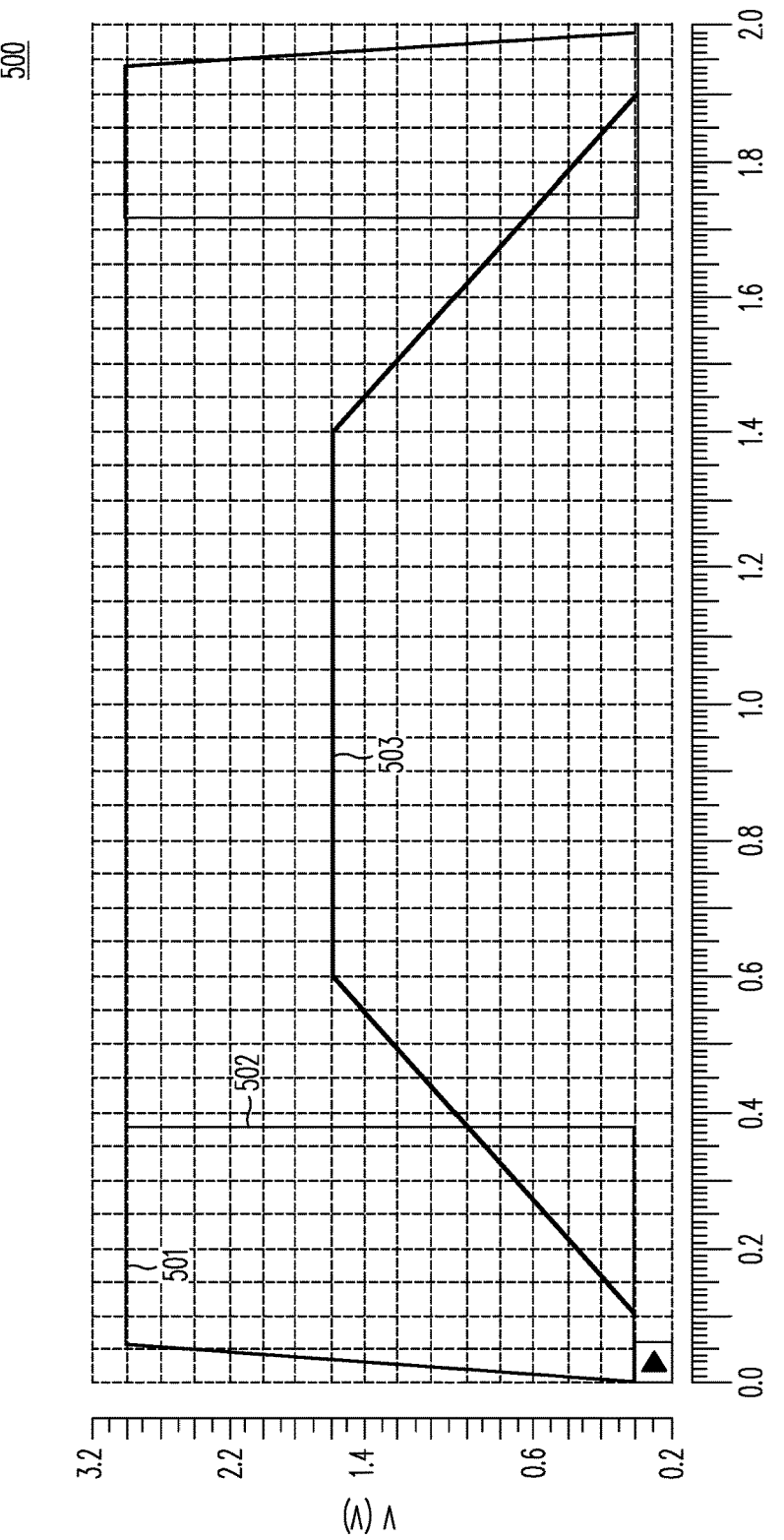
FIG. 5 is a graph illustrating an example of transient simulation in the circuit of FIG. 2 according to some embodiments.

FIG. 5 is a graph illustrating an example of transient simulation in safe state circuit 200 according to some embodiments. Specifically, curve 501 shows the voltage at the vdd_3v pin, curve 502 shows the voltage at the vhigh pin, and curve 503 shows the voltage at the vdd_1p8 pin. As may be seen from graph 500, DC currents are very low and timing delays can be significant. Because the effective rising threshold is increased, delays are not important in that case (since safe state would signal safe flag with higher voltage). For a falling threshold however, the delay must be kept small, because providing an out-of-safe flag while voltage is falling is important to maintain integrity.

Figure 6:
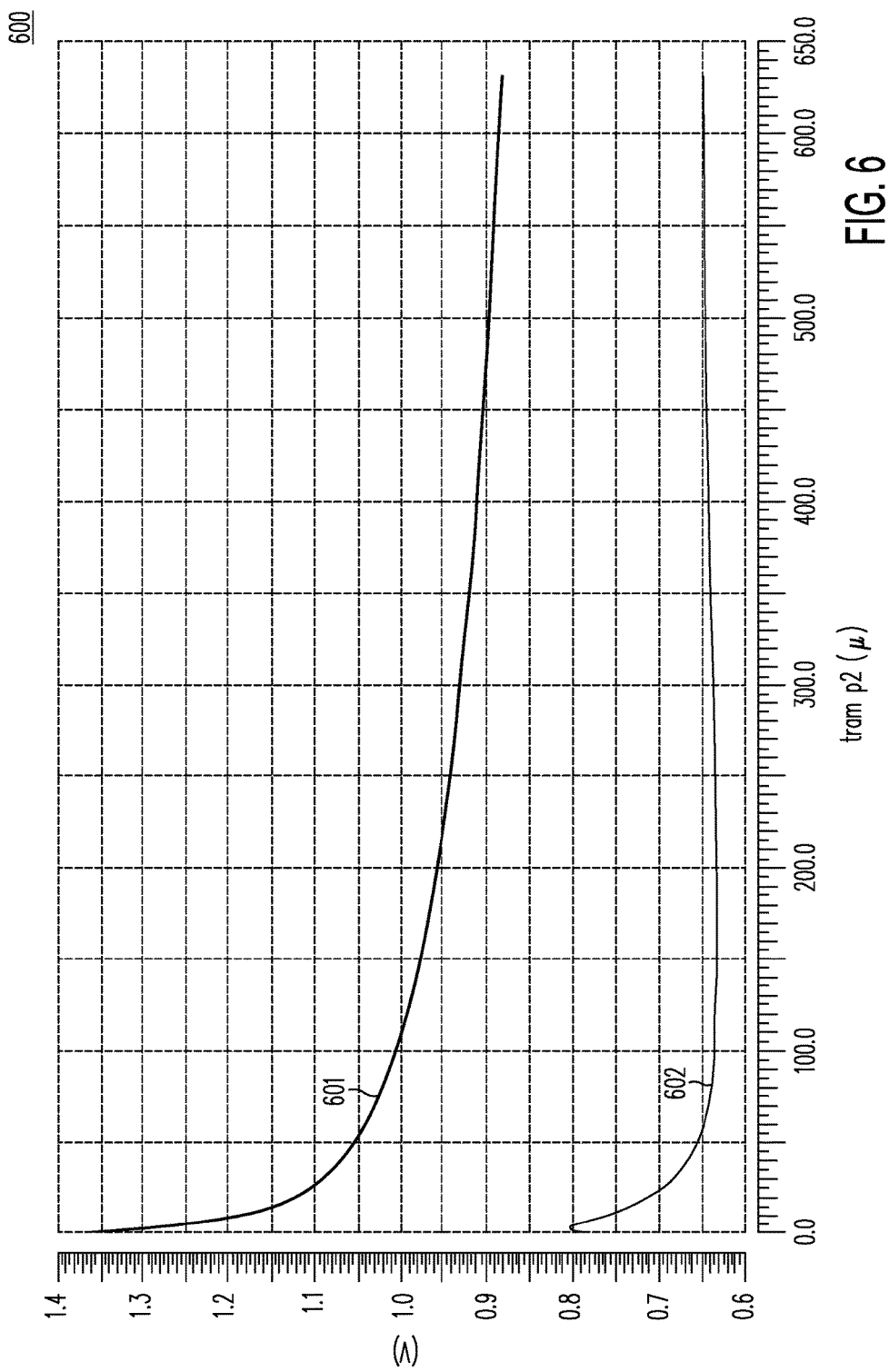
FIG. 6 is a graph illustrating an example of rising and falling thresholds in the circuit of FIG. 2 according to some embodiments.

FIG. 6 is a graph illustrating an example of rising and falling thresholds by ramp duration in safe state circuit 200 according to some embodiments. In order to minimize the delays, especially during fast ramp rates, a capacitive element 209 has been added. For higher ramp rates, the effective rising threshold (vtr_up) curve 601 increases. The effective falling threshold (vtr_down) curve 602 raises instead of falling due to the inserted capacitance element 209, hence yielding a fast response for fast falling ramps. The fast response for fast falling ramp is a desirable behavior because the out of safe condition is correctly flagged.

Figure 7:
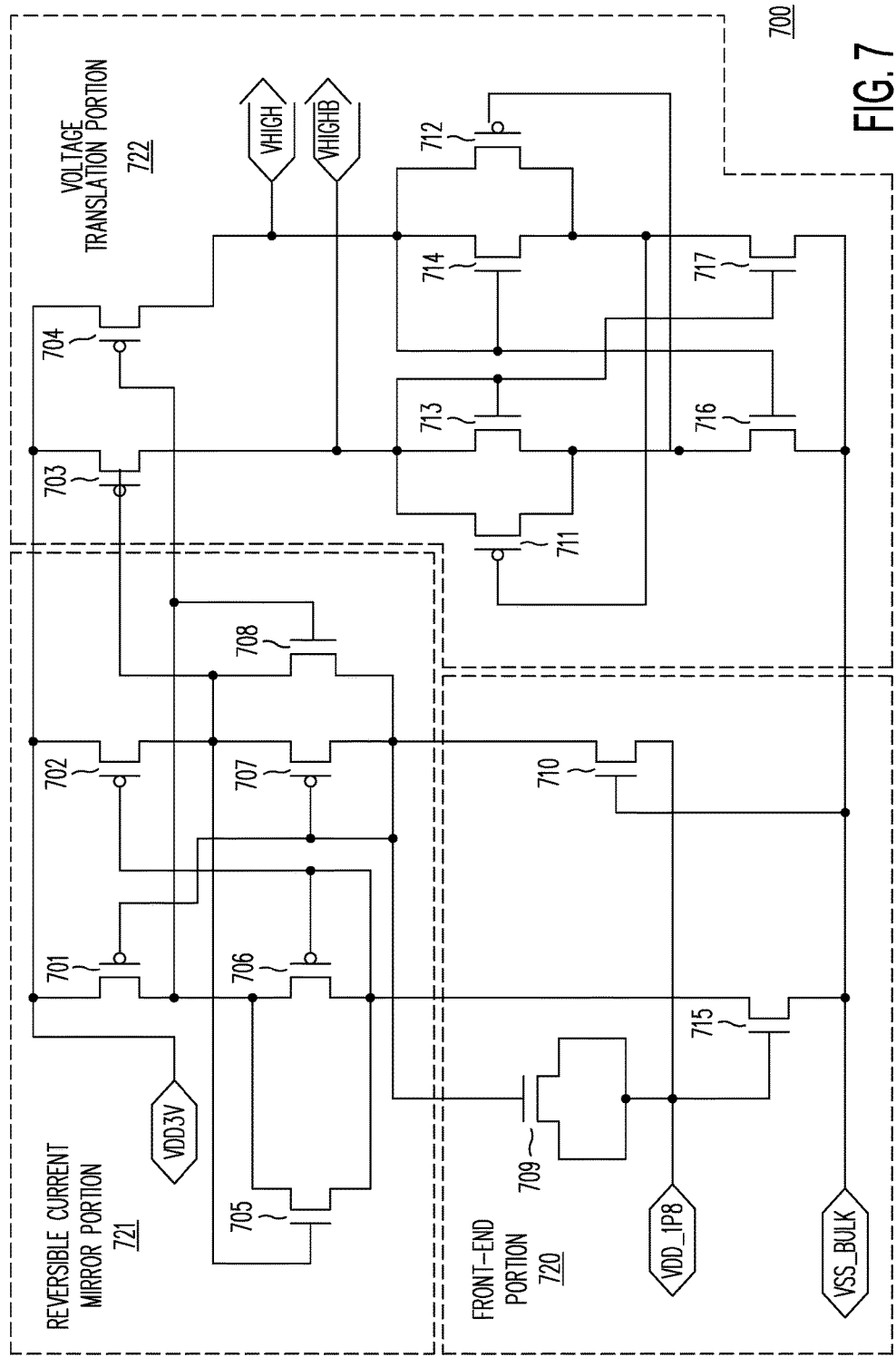
FIG. 7 is a schematic diagram of an example of a low-current circuit for supply voltage level detection circuit according to some embodiments.

FIG. 7 is a schematic diagram of an example of a low-current circuit for supply voltage level detection circuit according to some embodiments. As with circuit 200 of FIG. 2, here circuit 700 also has ground pin "vss_bulk;" supply pin "vdd3v," input pin "vdd_1p8," and two complementary output pins "vhigh" and "vhighb." Components of circuit 700 also include front-end portion 720, reversible current mirror portion 721 (coupled to front-end portion 720), and voltage-level translation portion 722 (coupled to reversible current mirror portion 721).

In front-end portion 721, first n-type transistor 715 has a source terminal coupled to vss_bulk and natural threshold transistor 710 has a source terminal coupled to first supply voltage and input pin vdd_1p8.

Reversible current mirror portion 721 includes first p-type transistor 707 having a drain terminal coupled to a drain terminal of natural threshold transistor 710. Second p-type transistor 702 has a drain terminal coupled to a source terminal of first p-type transistor 707 and a source terminal coupled to second supply voltage vdd3v. Third p-type transistor 706 has a drain terminal coupled to a drain terminal of first n-type transistor 715. Fourth p-type transistor 701 has a source terminal coupled to the second supply voltage vdd3v and a gate terminal coupled to a gate terminal of first p-type transistor 707. The gate terminal of first p-type transistor 707 is coupled to the drain terminal of first p-type transistor 707, and the gate terminal of third p-type transistor 706 is coupled to the drain terminal of third p-type transistor 706.

Second n-type transistor 708 has a drain terminal coupled to the source terminal of first p-type transistor 707 and a source terminal coupled to the drain terminal of first p-type transistor 707. Third n-type transistor 705 has a drain terminal coupled to the source terminal of third p-type transistor 706 and a source terminal coupled to a drain terminal of third p-type transistor 706.

Capacitive element 709 (here implemented as an n-type transistor) is coupled between the drain terminal of first p-type transistor 707 and the gate terminal of first n-type transistor 715. Fifth p-type transistor 704 has a source terminal coupled to second supply voltage vdd3v, a gate terminal coupled to a gate terminal of second n-type transistor 708 and to the drain terminal of fourth p-type transistor 701. Sixth p-type transistor 703 has a source terminal coupled to second supply voltage vdd3v, a gate terminal coupled to the drain terminal of second p-type transistor 702 and to a gate terminal of third n-type transistor 705.

Voltage-level translation portion 722 includes fourth n-type transistor 713 having a drain terminal coupled to a drain terminal of fifth p-type transistor 703. Fifth n-type transistor 716 has a drain terminal coupled to a source terminal of fourth n-type transistor 713 and a source terminal coupled to vss_bulk. Sixth n-type transistor 714 has a drain terminal coupled to a drain terminal of sixth p-type transistor 704 and a gate terminal coupled to a gate terminal of fifth n-type transistor 716. Seventh n-type transistor 717 has a drain terminal coupled to a source terminal of sixth n-type transistor 714 and a source terminal coupled to vss_bulk. The drain terminal of fourth n-type transistor 713 is coupled to the gate terminal of fourth n-type transistor 713, and the drain terminal of sixth n-type transistor 714 is coupled to the gate terminal of sixth n-type transistor 714.

Seventh p-type transistor 712 has a source terminal coupled to the drain terminal of sixth n-type transistor 714, a drain terminal coupled to the source terminal of sixth n-type transistor 714, and a gate terminal coupled to a source terminal of fourth n-type transistor 713. Eighth p-type transistor 711 has a source terminal coupled to a drain terminal of fourth n-type transistor 713, a drain terminal coupled to a source terminal of fourth n-type transistor 713, and a gate terminal coupled to a source terminal of sixth n-type transistor 714.

In contrast with n-type transistors shown in FIG. 7, which have their body voltages tied to vss_bulk, all p-type transistors may have body or bias voltages tied to vdd3v. A gate control signal may be provided at the drain terminal of fifth p-type transistor 703 or the drain terminal of sixth p-type transistor 704.

As shown, front-end of safe state circuit 700 has a reversible mirror connected to nodes at the drain of first p-type transistor 707 and third p-type transistor 706. The input voltage that equalizes the electrical currents at these two nodes sets the threshold voltage.

Particularly, with 0.0 V in vdd_1p8 pin, natural threshold transistor 710 is turned-on with a substantial current and first n-type transistor 715 is turned-off. As the voltage at the vdd_1p8 pin rises, the current through natural transistor 710 decreases (gate-to-source voltage of transistor 710 decreases) and the current through first n-type transistor 715 increases (gate-to-source voltage of transistor 710 increases). Hence, there is a voltage when these two currents are equal, and this is the threshold voltage.

Consider that first n-type transistor 715 (MN1) and natural threshold transistor 710 (MN0) are in subthreshold region when the vhigh signal switches. First n-type transistor 715 is a standard transistor, and its equation is:

$$I_{DMN1} = I_{SVT} \frac{W_1}{L_1} e^{\frac{V_{GS}-V_{TS}}{\eta_S \cdot V_t}} = I_{SVT} \frac{W_1}{L_1} e^{\frac{V_i-V_{TS}}{\eta_S \cdot V_t}}$$

Meanwhile, natural threshold transistor 710 is a natural transistor, and its equation is:

$$I_{DMN0} = I_{NVT} \frac{W_0}{L_0} e^{\frac{V_{GS}-V_{TN}}{\eta_N \cdot V_t}} = I_{NVT} \frac{W_0}{L_0} e^{\frac{-V_i-V_{TN}}{\eta_N \cdot V_t}}$$

During the switching, first n-type transistor 715 and natural threshold transistor 710 have the same calculated current:

$$I_{DMN1}(V_{isw}) = I_{MN0}(V_{isw})$$

$$I_{SVT} \frac{W_1}{L_1} e^{\frac{V_{isw}-V_{TS}}{\eta_S \cdot V t}} = I_{NVT} \frac{W_0}{L_0} e^{\frac{-V_{isw}-V_{TN}}{\eta_N \cdot V t}}$$

$$e^{\left[\frac{V_{isw}-V_{TS}}{\eta_S \cdot Vt} + \frac{V_{isw}+V_{TN}}{\eta_N \cdot Vt}\right]} = \frac{I_{NVT}}{I_{SVT}} \frac{\frac{W_0}{L_0}}{\frac{W_1}{L_1}}$$

$$\frac{V_{isw}-V_{TS}}{\eta_S \cdot Vt} + \frac{V_{isw}+V_{TN}}{\eta_N \cdot Vt} = \ln\left[\frac{I_{NVT}}{I_{SVT}} \frac{\frac{W_0}{L_0}}{\frac{W_1}{L_1}}\right]$$

$$\frac{\eta_N \cdot V_{isw} - \eta_N \cdot V_{TS} + \eta_S \cdot V_{isw} + \eta_S \cdot V_{TN}}{\eta_N \cdot \eta_S \cdot Vt} = \ln\left[\frac{I_{NVT}}{I_{SVT}} \frac{\frac{W_0}{L_0}}{\frac{W_1}{L_1}}\right]$$

$$(\eta_N + \eta_S) \cdot V_{isw} - \eta_N \cdot V_{TS} + \eta_S \cdot V_{TN} = \eta_N \cdot \eta_S \cdot Vt \cdot \ln\left[\frac{I_{NVT}}{I_{SVT}} \frac{\frac{W_0}{L_0}}{\frac{W_1}{L_1}}\right]$$

$$(\eta_N + \eta_S) \cdot V_{isw} = \eta_N \cdot \eta_S \cdot Vt \cdot \ln\left[\frac{I_{NVT}}{I_{SVT}} \frac{\frac{W_0}{L_0}}{\frac{W_1}{L_1}}\right] + \eta_N \cdot V_{TS} - \eta_S \cdot V_{TN}$$

Accordingly:

$$V_{isw} = \frac{\left(\eta_N \cdot \eta_S \cdot Vt \cdot \ln\left[\frac{I_{NVT}}{I_{SVT}} \frac{\frac{W_0}{L_0}}{\frac{W_1}{L_1}}\right] + \eta_N \cdot V_{TS} - \eta_S \cdot V_{TN}\right)}{(\eta_N + \eta_S)} \quad \text{(Equation 2)}$$

It should be noted that the term $$\eta_N \cdot \eta_S \cdot Vt \cdot \ln\left[\frac{I_{NVT}}{I_{SVT}} \frac{\frac{W_0}{L_0}}{\frac{W_1}{L_1}}\right]$$

has a positive temperature coefficient. Conversely, the term $(\eta_N \cdot V_{TS} - \eta_S \cdot V_{TN})$ has a negative temperature coefficient. And the term $(\eta_N + \eta_S)$ have almost no variation with temperature. As such, the sum of these two terms may be configured to produce a switching threshold ($V_{isw}$) with low temperature variation. Also, because the other terms do not have much variation with manufacturing process, the final threshold voltage has a small total variation.

Figure 8:
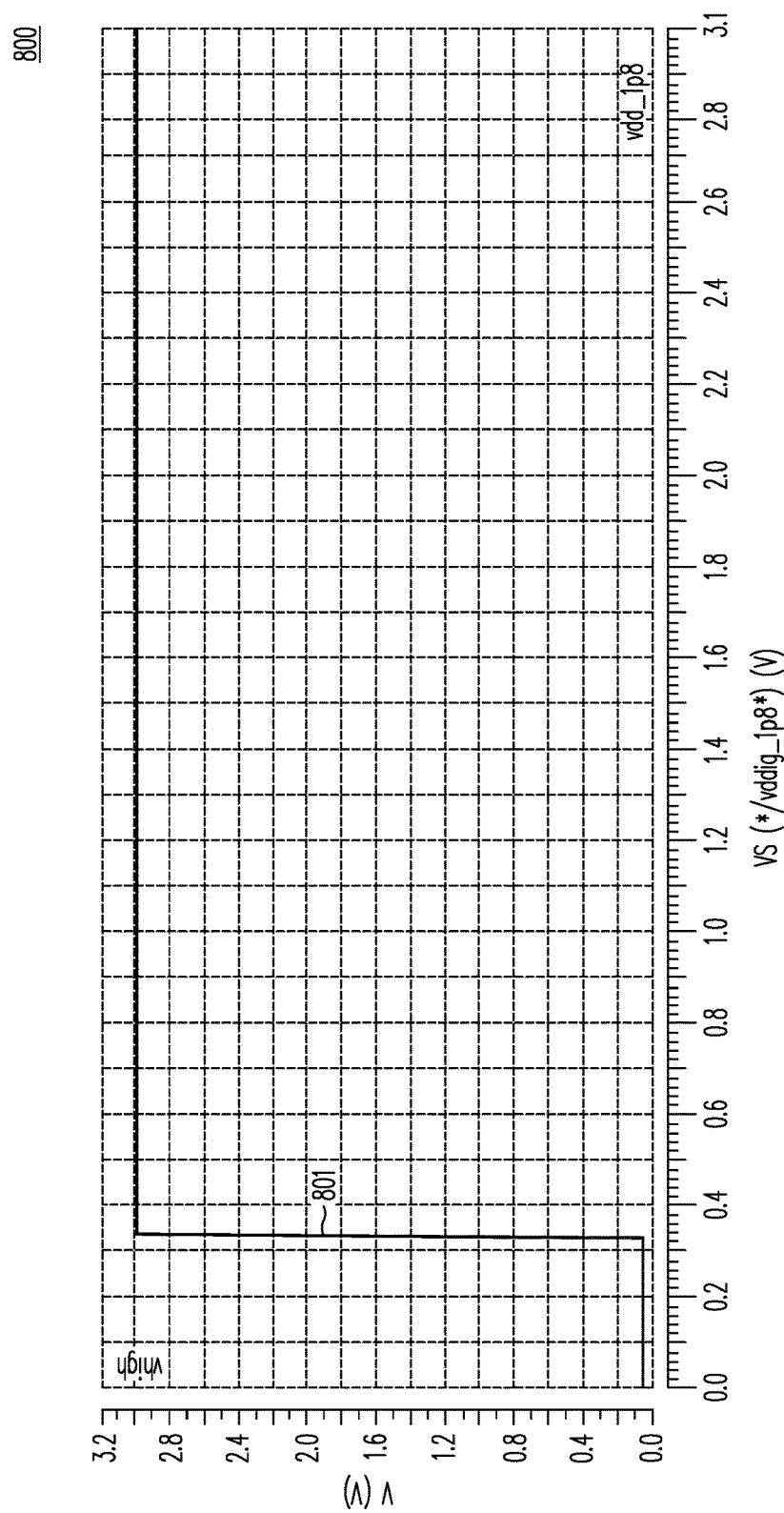
FIG. 8 is a graph illustrating an example of a Direct Current (DC) transfer curve for the circuit of FIG. 7 according to some embodiments.

FIG. 8 shows graph 800 illustrating an example of a DC transfer current for safe state circuit 700 according to some embodiments. Here, DC transfer curve 801 from the vdd_1p8 pin to the output node (vhigh pin) shows that, unlike circuit 200 of FIG. 2, this low voltage safe state does not have hysteresis in its transfer function.

Figure 9:
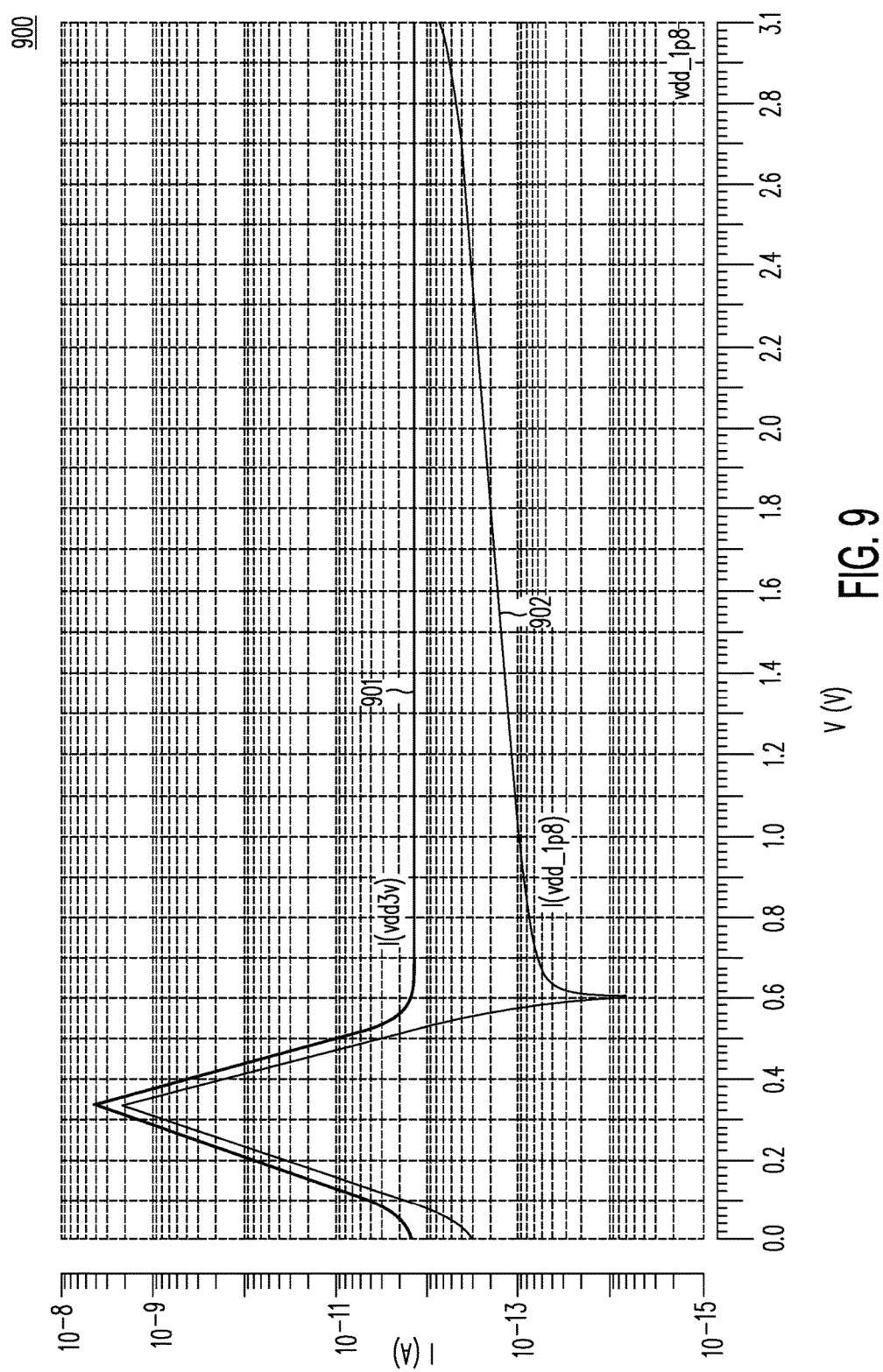
FIG. 9 is a graph illustrating an example of electrical currents in the circuit of FIG. 7 according to some embodiments.

Also, safe state circuit 700 has a low current consumption for the entire input voltage range. FIG. 9 shows graph 900 illustrating an example of electrical currents in safe state circuit 700 according to some embodiments. During input DC sweep, supply current curve 901 (vdd_3v) and input current curve 902 (vdd_1p8) require a maximum DC current, close to threshold, of just few nano-Amperes.

Figure 10:
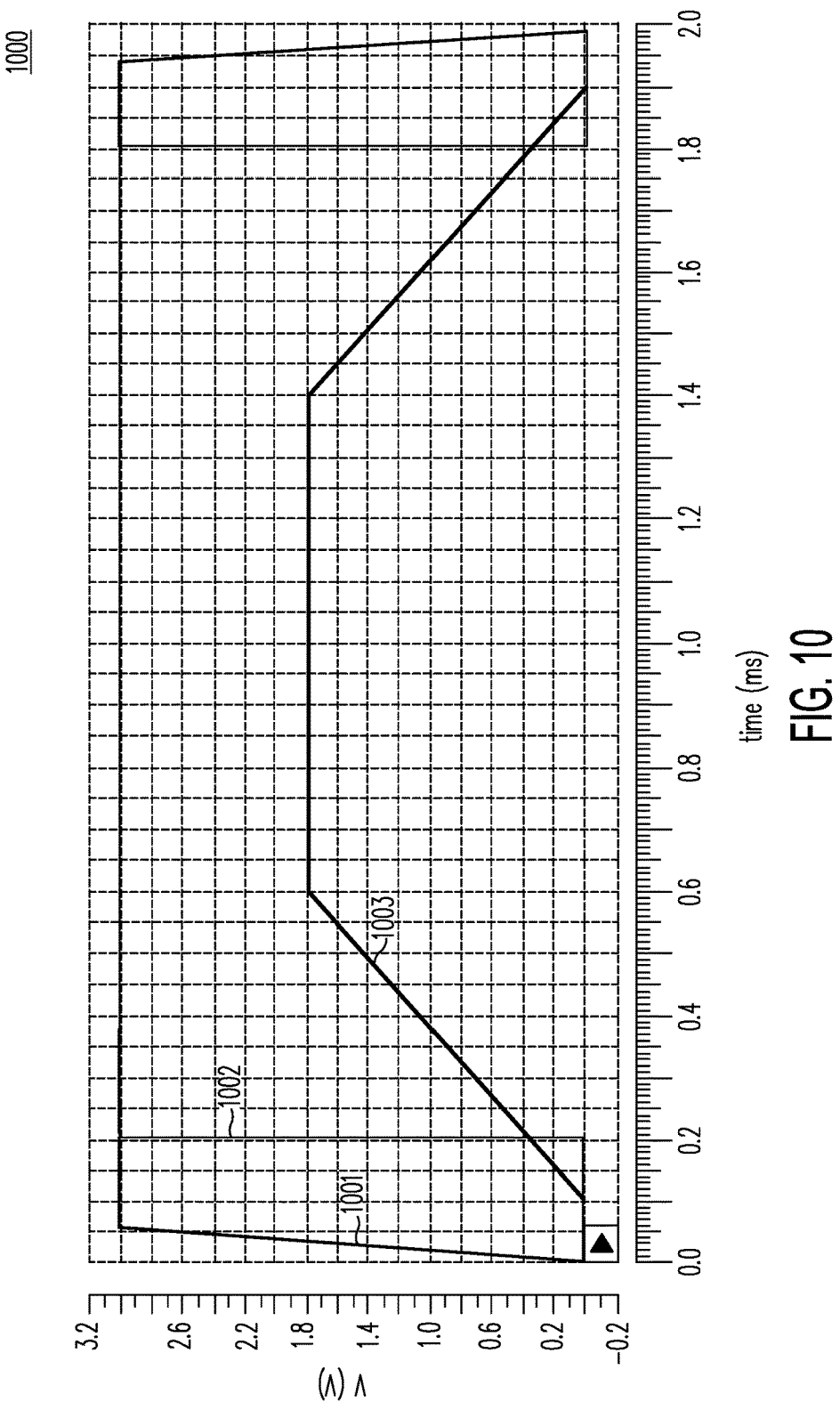
FIG. 10 is a graph illustrating an example of transient simulation in the circuit of FIG. 7 according to some embodiments.

FIG. 10 shows graph 1000 illustrating an example of transient simulation in safe state circuit 700 according to some embodiments. Curve 1001 shows the voltage at the vdd_3v pin, curve 1002 shows the voltage at the vhigh pin, and curve 1003 shows the voltage at the vdd_1p8 pin. Again, as may be seen from graph 1000, since DC currents are very low, timing delays can be significant. For the falling threshold, in order to minimize the delays, especially during fast ramp rates, capacitive element 709 is added.

Figure 11:
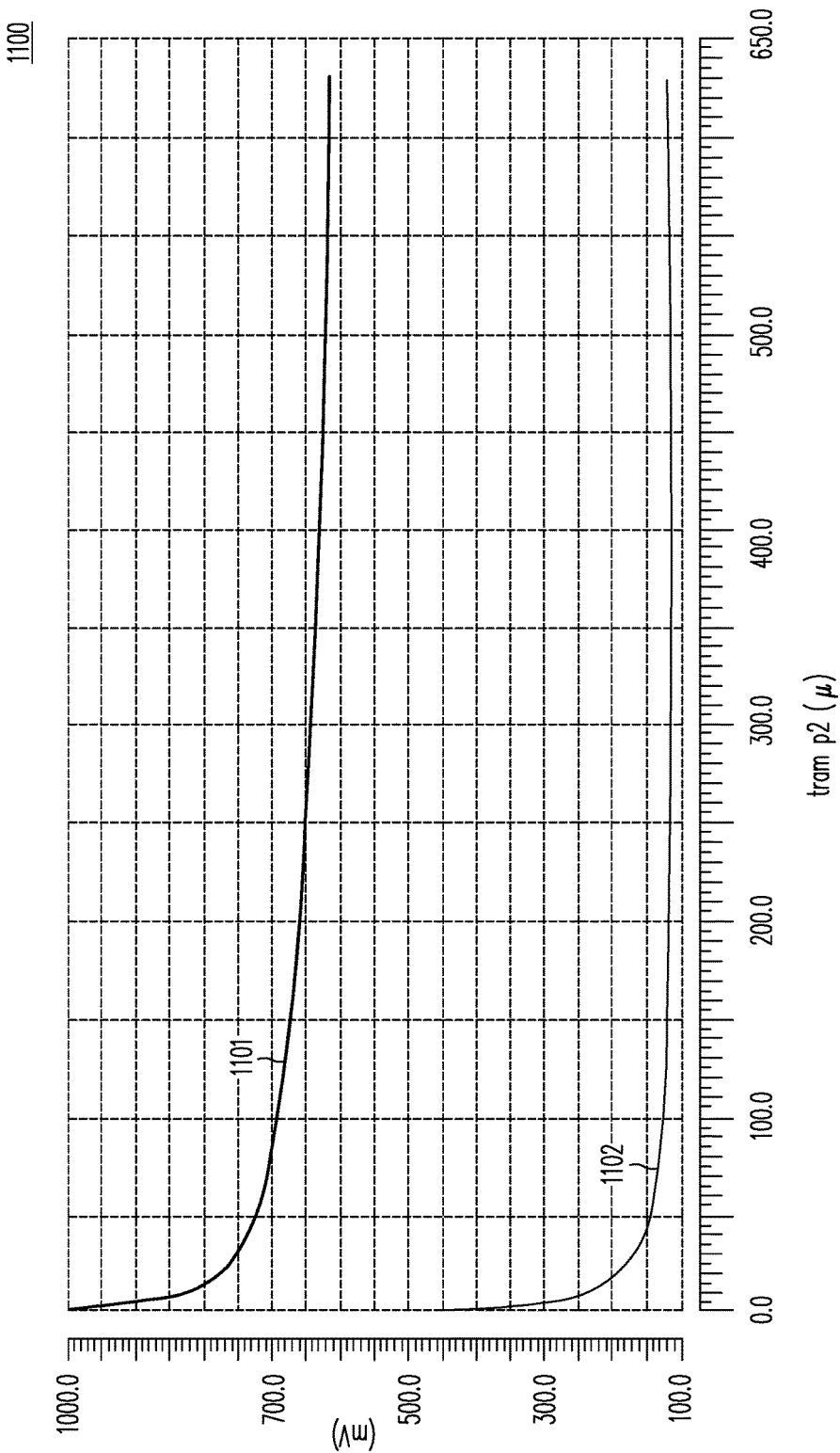
FIG. 11 is a graph illustrating an example of rising and falling thresholds in the circuit of FIG. 7 according to some embodiments.

FIG. 11 shows graph 1100 illustrating an example of rising and falling thresholds in safe state circuit 700 according to some embodiments. For higher ramp rates (low ramp durations), the effective rising threshold (vtr_up) curve 1101 increases. The effective falling threshold (vtr_down) curve 1102 raises instead of falling due to the inserted capacitive element 709, hence yielding a fast response for fast falling ramps.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An Integrated Circuit (IC), comprising:
 a first logic circuit coupled to a second logic circuit via a level shifter; and
 a safe state circuit coupled to the first logic circuit and to a first input of a logic gate, wherein a second input of the logic gate is coupled to an output of the level shifter, and wherein an output of the logic gate is coupled to the second logic circuit, the safe state circuit further comprising:
  a front-end portion configured to monitor a supply voltage of the first logic circuit; and
  a voltage-level translation portion coupled to the front-end portion via a reversible current mirror portion, wherein the voltage-level translation portion is configured to apply a logic value to the first input to the logic gate that indicates validation of the supply voltage.

2. The IC of claim 1, wherein the front-end portion comprises:
a first n-type transistor having a source terminal coupled to ground;
a first natural threshold transistor having a source terminal coupled to a drain terminal of the first n-type transistor, and a gate terminal coupled to a gate terminal of the first n-type transistor;
a second natural threshold transistor having a gate terminal coupled to the gate terminal of the first n-type transistor, and a source terminal coupled to a first supply voltage of the first logic circuit; and
a second n-type transistor having a source terminal coupled to a drain terminal of the first natural threshold transistor and a gate terminal coupled to the first supply voltage.

3. The IC of claim 2, wherein the reversible current mirror portion comprises:
a first p-type transistor having a drain terminal coupled to a drain terminal of the second n-type transistor;
a second p-type transistor having a drain terminal coupled to a source terminal of the second p-type transistor and a source terminal coupled to a second supply voltage of the second logic circuit;
a third p-type transistor having a drain terminal coupled to a drain terminal of the second natural threshold transistor and a gate terminal coupled to a gate terminal of the second p-type transistor; and
a fourth p-type transistor having a source terminal coupled to the second supply voltage and a gate terminal coupled to a gate terminal of the first p-type transistor, wherein the gate terminal of the first p-type transistor is coupled to the drain terminal of the first p-type transistor, and wherein the gate terminal of the third p-type transistor is coupled to the drain terminal of the third p-type transistor.

4. The IC of claim 3, further comprising:
a third n-type transistor having a drain terminal coupled to the source terminal of the first p-type transistor and a source terminal coupled to the drain terminal of the first p-type transistor; and
a fourth n-type transistor having a drain terminal coupled to the source terminal of the third p-type transistor and a source terminal coupled to a drain terminal of the third p-type transistor.

5. The IC of claim 4, further comprising:
a capacitor coupled between the source terminal of the fourth n-type transistor and the gate terminal of the second n-type transistor.

6. The IC of claim 5, further comprising:
a fifth p-type transistor having a source terminal coupled to the second supply voltage, a gate terminal coupled to a gate terminal of the third n-type transistor and to the drain terminal of the fourth p-type transistor; and
a sixth p-type transistor having a source terminal coupled to the second supply voltage, a gate terminal coupled to the drain terminal of the second p-type transistor and to a gate terminal of the fourth n-type transistor.

7. The IC of claim 6, wherein the voltage-level translation portion further comprises:
a fifth n-type transistor having a drain terminal coupled to a drain terminal of the fifth p-type transistor;
a sixth n-type transistor having a drain terminal coupled to a source terminal of the fifth n-type transistor and a source terminal coupled to ground;
a seventh n-type transistor having a drain terminal coupled to a drain terminal of the sixth p-type transistor and a gate terminal coupled to a gate terminal of the sixth n-type transistor; and
an eighth n-type transistor having a drain terminal coupled to a source terminal of the seventh n-type transistor and a source terminal coupled to ground, wherein the drain terminal of the fifth n-type transistor is coupled to the gate terminal of the fifth n-type transistor, and wherein the drain terminal of the seventh n-type transistor is coupled to the gate terminal of the seventh n-type transistor.

8. The IC of claim 7, further comprising:
a seventh p-type transistor having a source terminal coupled to the drain terminal of the seventh n-type transistor, a drain terminal coupled to the source terminal of the seventh n-type transistor, and a gate terminal coupled to a source terminal of the fifth n-type transistor; and
an eighth p-type transistor having a source terminal coupled to a drain terminal of the fifth n-type transistor, a drain terminal coupled to a source terminal of the fifth n-type transistor, and a gate terminal coupled to a source terminal of the seventh n-type transistor.

9. The IC of claim 8, further wherein the first input to the logic gate is coupled to: the drain terminal of the seventh p-type transistor.

10. The IC of claim 8, further wherein the first input to the logic gate is coupled to the gate terminal of the seventh p-type transistor.

11. The IC of claim 1, wherein the front-end portion comprises:
a first n-type transistor having a source terminal coupled to ground; and
a natural threshold transistor having a source terminal coupled to a first supply voltage of the first logic circuit.

12. The IC of claim 11, wherein the reversible current mirror portion comprises:
a first p-type transistor having a drain terminal coupled to a drain terminal of the first natural threshold transistor;
a second p-type transistor having a drain terminal coupled to a source terminal of the second p-type transistor and a source terminal coupled to a second supply voltage of the second logic circuit;
a third p-type transistor having a drain terminal coupled to a drain terminal of the first n-type transistor; and
a fourth p-type transistor having a source terminal coupled to the second supply voltage and a gate terminal coupled to a gate terminal of the first p-type transistor, wherein the gate terminal of the first p-type transistor is coupled to the drain terminal of the first p-type transistor, and wherein the gate terminal of the third p-type transistor is coupled to the drain terminal of the third p-type transistor.

13. The IC of claim 12, further comprising:
a second n-type transistor having a drain terminal coupled to the source terminal of the first p-type transistor and a source terminal coupled to the drain terminal of the first p-type transistor; and
a third n-type transistor having a drain terminal coupled to the source terminal of the third p-type transistor and a source terminal coupled to a drain terminal of the third p-type transistor.

14. The IC of claim 13, further comprising:
a capacitor coupled between the drain terminal of the first p-type transistor and the gate terminal of the first n-type transistor.

15. The IC of claim 14, further comprising:
a fifth p-type transistor having a source terminal coupled to the second supply voltage, a gate terminal coupled to a gate terminal of the second n-type transistor and to the drain terminal of the fourth p-type transistor; and
a sixth p-type transistor having a source terminal coupled to the second supply voltage, a gate terminal coupled to the drain terminal of the second p-type transistor and to a gate terminal of the third n-type transistor.

16. The IC of claim 15, wherein the voltage-level translation portion further comprises:
a fourth n-type transistor having a drain terminal coupled to a drain terminal of the fifth p-type transistor;
a fifth n-type transistor having a drain terminal coupled to a source terminal of the fourth n-type transistor and a source terminal coupled to ground;
a sixth n-type transistor having a drain terminal coupled to a drain terminal of the sixth p-type transistor and a gate terminal coupled to a gate terminal of the fifth n-type transistor; and
a seventh n-type transistor having a drain terminal coupled to a source terminal of the sixth n-type transistor and a source terminal coupled to ground, wherein the drain terminal of the fourth n-type transistor is coupled to the gate terminal of the fourth n-type transistor, and wherein the drain terminal of the sixth n-type transistor is coupled to the gate terminal of the sixth n-type transistor.

17. The IC of claim 16, further comprising:
a seventh p-type transistor having a source terminal coupled to the drain terminal of the sixth n-type transistor, a drain terminal coupled to the source terminal of the sixth n-type transistor, and a gate terminal coupled to a source terminal of the fourth n-type transistor; and
an eighth p-type transistor having a source terminal coupled to a drain terminal of the fourth n-type transistor, a drain terminal coupled to a source terminal of the fourth n-type transistor, and a gate terminal coupled to a source terminal of the sixth n-type transistor.

18. The IC of claim 17, further wherein the first input to the logic gate is coupled to the drain terminal of the fifth p-type transistor or to the drain terminal of the sixth p-type transistor.

19. A safe state circuit coupled between a first logic domain and a second logic domain of an Integrated Circuit (IC), the safe state circuit comprising:
a front-end portion configured to monitor a supply voltage of the first logic domain, the front-end portion comprising:
a first n-type transistor having a source terminal coupled to ground;
a first natural threshold transistor having a source terminal coupled to a drain terminal of the first n-type transistor, and a gate terminal coupled to a gate terminal of the first n-type transistor;
a second natural threshold transistor having a gate terminal coupled to the gate terminal of the first n-type transistor, and a source terminal coupled to a first supply voltage of the first logic circuit; and
a second n-type transistor having a source terminal coupled to a drain terminal of the first natural threshold transistor and a gate terminal coupled to the first supply voltage; and
a voltage-level translation portion coupled to the front-end portion via a reversible current mirror portion, wherein the voltage-level translation portion is configured to indicate validation of the supply voltage.

20. A method, comprising:
monitoring a supply voltage of a first logic circuit via front-end portion of a safe state circuit, wherein the safe state circuit is coupled to the first logic circuit and to a first input of a logic gate, wherein a second input of the logic gate is coupled to an output of the level shifter, wherein an output of the logic gate is coupled to the second logic circuit, and wherein the front-end portion further comprises:
a first n-type transistor having a source terminal coupled to ground; and
a natural threshold transistor having a source terminal coupled to a first supply voltage of the first logic circuit; and
indicating validation of the supply voltage using a voltage-level translation portion coupled to the front-end portion via a reversible current mirror portion, wherein the voltage-level translation portion is configured to apply a logic value to the first input to the logic gate that indicates validation of the supply voltage.

* * * * *